Aug. 27, 1974 J. A. VERSTRAETE ET AL 3,832,176

NOVEL PHOTORESIST ARTICLE AND PROCESS FOR ITS USE

Filed April 6, 1973

United States Patent Office 3,832,176

Patented Aug. 27, 1974

3,832,176

NOVEL PHOTORESIST ARTICLE AND PROCESS FOR ITS USE

Jerome A. Verstraete, John M. Noonan, and Richard W. Neubert, Rochester, N.Y., assignors to Eastman Kodak Company, Rochester, N.Y.

Filed Apr. 6, 1973, Ser. No. 348,579
Int. Cl. G03c *1/76*
U.S. Cl. 96—67 19 Claims

ABSTRACT OF THE DISCLOSURE

An article is disclosed having an insulative support on which is positioned an etchant destructible plating layer having a thickness of less than 10,000 Angstroms and, preferably, less than 5,000 Angstroms. A photoresist layer overlies the plating layer. A protective layer can overlie the photoresist layer. Unexposed areas of the photoresist layer are capable of being removed by a non-etching solvent to leave the plating layer substantially micro-residue free. This permits plating a metal layer over the uncovered portions of the thin plating layer without employing a cleaning etchant capable of destroying or damaging the plating layer. The plated metal layer can be electroplated or electrolessly deposited onto the plating layer to form a tenaciously adherent coating.

The present invention is directed to a novel dry photoresist article incorporating a thin, destructible plating layer. More specifically, the invention is directed to a dry photoresist article incorporating a photoresist layer of exceptionally clean developing characteristics and a thin, etchant destructible layer intended to facilitate the plating of a conductive metal. In a preferred application this invention is directed to an electrical circuit precursor. The present invention is also directed to a process for using the articles of this invention. More specifically, this invention is directed to a plating process using the article of this invention, and in a preferred application, to a process for preparing an electrical circuit.

Photoresist compositions and their use are well known to those skilled in the art. In an exemplary application, a photoresist composition is applied as a coating to a substrate. The photoresist coating is then imagewise exposed to actinic radiation. Depending on whether the photoresist composition is chosen to be positive or negative working, the photoresist layer can be selectively removed in either irradiated or non-irradiated areas, respectively.

Photoresists have been characterized as "wet" photoresists and "dry" photoresists. So-called wet photoresists are those sold as a solution or dispersion which the user coats onto a substrate to form a photoresist layer. Liquid developers are used to cause the photoresist layer to define the pattern of imagewise exposure.

Dry photoresists are those sold as articles in which a photoresist layer is sandwiched between two plastic sheets. One of these sheets is a thin protective sheet that is removed to allow the photoresist layer to be laminated to a substrate. Exposure of the laminated photoresist layer can be achieved through the remaining plastic sheet associated therewith. After exposure the remaining plastic sheet is stripped away. In a conventional system, a portion of the photoresist layer can adhere to the second plastic sheet as it is being stripped away so that the portion of the photoresist layer remaining on the substrate defines the desired image pattern. Liquid developers can also be used with dry photoresists to define the image pattern, if desired.

Photoresist compositions have found wide use and have been used extensively in forming electrical circuits. In an exemplary preparation of an electrical circuit, an electrically insulative support is provided with an electrically conductive metal surface layer by coating or by laminating. A photoresist layer is located over the conductive layer and given an imagewise exposure. The photoresist layer is then selectively removed to define the desired electrical circuit pattern.

Either an additive or a subtractive process can be used to form the circuit. In the subtractive process, the portion of the conductive layer that is not protected by the photoresist layer after development is etched away. The portion of the conductive layer lying beneath the remaining, pattern-forming portion of the photoresist then forms the conductors of the electrical circuit.

In the additive process, the portion of the conductive layer exposed by removal of the photoresist is further cleaned, as by etching, and metal is plated onto the conductive layer. Typically, the plated metal is chosen to be etched-resistant or is plated to a much greater thickness than the conductive layer initially present. After plating, etching solutions are used to remove the remaining photoresist and that portion of the conductive layer lying therebeneath. The conductors of the electrical circuit are formed primarily by the plated metal and, normally to a lesser extent, by the remnant of the conductive layer present therebeneath.

While the subtractive process is simpler to use, since it involves fewer steps and avoids metal plating entirely, there has been an increasing interest in the additive process, since this process produces less metal waste. In the additive process the conductive layer initially present can be of much thinner gauge than the conductive layer utilized in the subtractive process because it is the plated metal which is relied upon to provide the desired level of conductance for the metal conductors. By contrast, to produce metal conductors by the subtractive process, the conductive layer initially present must form the entire conductor.

Although the additive process requires less metal than the subtractive process, a very substantial amount of metal is still wasted. The reason for this is that no way has been found in the art to utilize conductive layers of the minimal thicknesses necessary for metal plating.

In the additive process, it is necessary to plate up on the exposed surface of the conductive layer in those areas from which photoresist has been removed by development. Unfortunately, conventional photoresists cannot be developed from the surface of the conductive layer without leaving behind micro-residues. These are thin, discontinuous layers seldom in excess of a few molecules in thickness and characteristically less than 100 Angstroms in thickness. For many applications, these micro-residues produce no adverse effects and are, accordingly, ignored. However, where metal plating onto a metal surface is required, as in the additive process, allowing micro-residues to remain results in discontinuous, non-adherent or very weakly adherent plate metal coatings.

It has been then necessary in plating onto metal surfaces from which a photoresist has been removed by development to etch the metal surface in order to insure the presence of a clean, substantially micro-residue free surface onto which metal plating can be reliably achieved. Inasmuch as a substantial portion of the conductive layer is etched away in cleaning to permit subsequent metal plating, the conductive layers employed have been limited in their minimal thicknesses. For example, prior to this invention, it has not been possible to successfully utilize conductive layers of thicknesses below about 10,000 Angstroms in conjunction with the preparation of an electrical circuit or a similar article by the additive process described above. It has been found that such thin metal layers are destructively attacked by the etchants necessary to insure the substantially complete removal of micro-residues that is required for uniform and reliable metal plating. For these reasons, conductive metal layers of less than about 1 micron have not been employed in forming electrical circuits or similar articles by the additive process, and much thicker layers have, of course, been required in forming such articles with the subtractive process.

Reducing the amount of metal lost by etching in practicing the additive process can significantly reduce operating costs. More importantly, reducing the amount of metal present in waste solutions can reduce the burden to manufacturers in disposing of these solutions, since the metal present can pose an ecological hazard.

While both wet and dry photoresists offer distinct and unique advantages to their users, many users prefer dry photoresists, since the photoresist manufacturer provides the user (albeit at a higher cost) with a thick, uniform photoresist coating not readily duplicated with most wet photoresists. However, the user must still laminate the dry photoresist layer onto a substrate, such as an insulative support bearing a conductive layer. This requires access to a rather expensive laminating machine. After lamination and exposure, the user strips away the plastic sheet initially supporting the photoresist layer. This sheet becomes a waste by-product which the user must dispose of together with the cover sheet that is stripped away before laminating.

It is an object of this invention to provide a dry photoresist article that is intended to be formed into an end-used article, such as an electrical circuit. It is another object to provide a dry photoresist article incorporating a photoresist having exceptionally clean developing characteristics. It is an additional object to provide a dry photoresist article that minimizes metal loss in practicing an additive plating and etching process. It is a specific object to provide a printed circuit precursor and, more specifically, an article which can be readily formed into a flexible printed circuit.

It is a separate object of this invention to provide a plating and etching process utilizing the articles of the invention. More specifically, it is an object to provide such a process that minimizes waste by-products and is simple and convenient to use. It is a particular object to provide a process that minimizes metal loss. It is a further object to provide an improved process for forming electrical circuits, especially flexible printed circuits, utilizing the articles of this invention.

In one aspect this invention is directed to an article of manufacture comprising an electrically insulative support means. An etchant destructible plating layer having a thickness of less than 10,000 Angstroms is located on the support means. Radiation-sensitive layer means overlie the destructible plating layer for permitting substantially microresidue free removal thereof from said plating layer in unexposed areas while protecting the destructible plating layer in remaining areas subsequent to radiation exposure.

In another aspect, this invention is directed to a process comprising providing, as a unitary article, an electrically insulative support, an etchant destructive plating layer having a thickness of less than 10,000 Angstroms located on the support, a photoresist layer on the plating layer and a transparent cover sheet is stripped away from the photoresist layer. The photoresist layer is exposed to actinic radiation in selected areas. The unexposed portions of the photoresist layer are substantially completely removed to uncover a substantially micro-residue free surface of the destructible plating layer. A tenaciously adherent conductive metallic layer means is plated over the uncovered surface of the destructible plating layer and, the remaining, exposed portions of the photoresist layer and that portion of the destructible plating layer underlying the remaining portions of the photoresist layer are etched away.

The invention may be better understood by reference to the following detailed description considered in conjunction with the drawings, in which FIG. 1 represents an article according to the present invention;

All figures are detailed sectional views.

Figure 1:
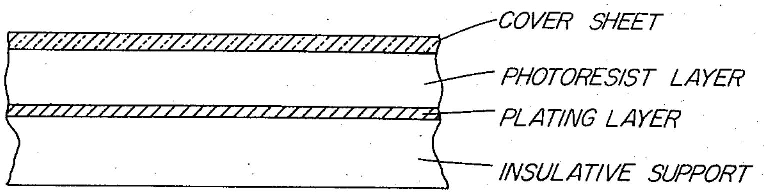

An article which constitutes a specific, preferred embodiment of this invention is shown in FIG. 1 to consist of an electrically insulative, preferably flexible, support on which is located a thin plating layer of less than 10,000 Angstroms in thickness and, preferably, of less than 5,000 Angstroms in thickness. Overlying the plating layer is a photoresist layer having exceptionally clean developing characteristics. That is, the photoresist layer composition is specifically chosen to be capable of development in a substantially micro-residue free manner. Overlying the photoresist layer is a cover sheet. In the preferred form, the cover sheet is a thin, flexible, transparent plastic sheet that can be readily stripped from the photoresist layer either before or after exposure.

Figure 2:
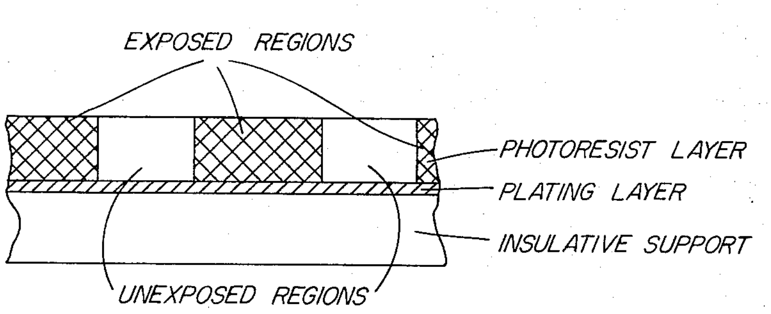
FIG. 2 represents this article after cover sheet removal and exposure.

The article is shown again in FIG. 2 after the cover sheet has been removed and the photoresist layer exposed to actinic radiation, typically ultraviolet radiation. When the cover sheet is transparent, the photoresist layer can be exposed through the cover sheet. Alternatively, the cover sheet can be stripped before exposure. It is recognized that the cover sheet and/or the insulative support can be purposely formed to be of high optical density or opaque to avoid accidental exposure of the photoresist layer. The cover sheet chemically and physically shields the photoresist layer and is particularly useful where the photoresist layer exhibits a degree of tack.

The photoresist layer is next removed by development in unexposed regions or areas. In a preferred form the unexposed photoresist regions can be cleanly removed by spraying with a mildly alkaline aqueous developer, such as an aqueous solution of alkali metal bicarbonates or dilute (0.1 N or less) alkali hydroxides. The photoresist is chosen to be readily soluble in the developer and to leave the uncovered portions of the thin plating layer substantially micro-residue free without the necessity of etching the plating layer. It is recognized that prior to this invention, it has been necessary to chemically etch plating layers in order to achieve a micro-residue free surface. As an alternative to etching, it is also known to physically scour the plating surface to remove micro-residues, although this is not practical in most applications, since physical scrubbing tends to damage the adjacent, exposed portions of the photoresist. This is particularly true where fine imaging is sought. The present invention is then unique in allowing the photoresist to be removed by a developer to leave a substantially micro-residue free plating layer surface without the necessity of etching or, less commonly, scrubbing. This permits the use of very thin plating layers. It is recognized that cleaning solutions that do not attack the plating layer can be employed to supplement the developer, if desired. For example, sulfuric acid, which will not remove photoresist micro-residues, will selectively remove oxides from copper surfaces without attacking the underlying metal.

Figure 3:
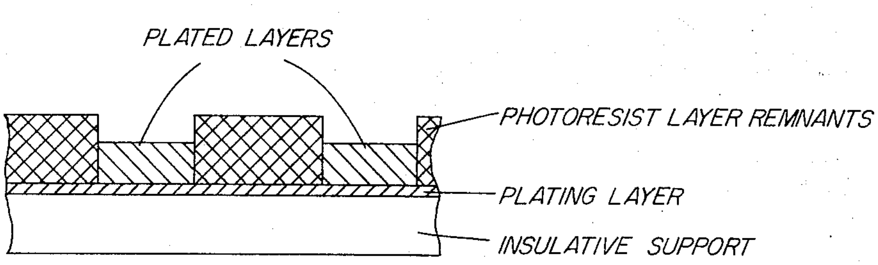
FIG. 3 represents the article of FIG. 2 after photoresist layer development and plating.

Onto the substantially micro-residue free uncovered surface of the plating layer is plated a metal to form one or more plated layers. The plating layer can be chosen to be a conductive metal so that electroplating onto the uncovered portions of this layer can be achieved by conventional techniques. Alternatively, where the plating layer is chosen to provide catalytic deposition sites, the plated layer can be deposited by electroless plating, i.e., chemical precipitation. It is also possible to uniformly deposit the plating layer over the entire surface of the article and rely on subsequent removal of the exposed photoresist to dislodge that portion of the plated layer overlying the photoresist, although this is not preferred. After developing and plating in the preferred manner, the article appears as shown in FIG. 3.

Figure 4:
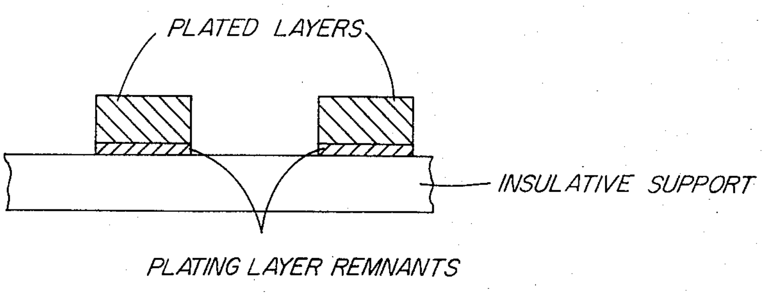
FIG. 4 represents the article of FIG. 3 after etching to remove exposed regions of the photoresist layer and unprotected portions of the plating layer.

To provide the final article, which can be, for example, an electrical circuit or any other desired useful article, it is merely necessary to etch away the exposed photoresist and that portion of the plating layer which lies beneath the photoresist and is not protected by the plated layer. Protected plating layer remnants beneath the plated layers serve to firmly bond the plated layers to the insulative support. The preferred form of the article produced is shown in FIG. 4. This article can be used as shown or can be further modified by addition or subtraction of materials by known manufacturing techniques. In one variant form, the article can initially bear a plating layer, photoresist layer and/or cover sheet on both major surfaces of the support. In this form, the final article can be a two-sided printed circuit—that is, a printed circuit having a pattern of conductors on each major surface of the support.

From the foregoing, the advantages of the novel dry photoresist article and process of this invention over those dry photoresist articles and use procedures heretofore known to the art are readily apparent. Whereas conventional dry photoresist articles have required lamination of the article, after cover sheet removal, to a substrate, typically an insulative support bearing a conductive layer, the present dry photoresist article incorporates the insulative support and therefore eliminates the need for the user to have a laminating capability. Further, the user need not engage in the cleaning procedures required prior to laminating. The present dry photoresist article differs also from conventional dry photoresist articles in incorporating a plating layer. This layer and its function are totally absent from conventional dry photoresist articles. Further, the present dry photoresist article employs a clean developing photoresist layer that does not leave behind substantial micro-residues after development. For this reason the article of this invention can utilize a plating layer of less than 10,000 angstroms in thickness, which is significantly thinner than the gauge of the conductive layers which are laminated to conventional dry photoresist articles in use. Additionally, using the dry photoresist article of this invention, it is possible to expose the photoresist directly without the necessity of transmitting actinic radiation through a cover sheet. With conventional dry photoresist articles the cover sheet is typically stripped only after photoresist exposure therethrough. Thus, the present invention offers the advantage of reducing any possibility of actinic radiation attenuation and/or scatters in transmission to the photoresist layer. Further, in the present article both the cover sheet and support can be opaque, or substantially so, to actinic radiation to protect that photoresist layer from accidental exposure. Still further, the present article produces less waste of materials than conventional dry photoresist articles. Still other advantages of the present invention will be apparent from the discussion which follows.

Any conventional insulative support can be used in the practice of this invention. Those supports which are to be considered to be insulative within the purview of this invention are those which exhibit, at least adjacent the plating layer, a surface resistivity in excess of $10^8$ ohms per square and, preferably, at least $10^{12}$ ohms per square. As is well understood by those skilled in the art, surface resistivity is determined by measuring the resistance between two parallel electrodes of a given length spaced apart by the same distance along a surface. Since an increase in the length of the electrodes tends to decrease the resistance observed by an amount equal to that by which the resistance would be increased by lengthening the spacing between the electrodes by a like increment, it is apparent that the electrode length and spacing are not material so long as they are identical. Hence, the surface resistivity expressed in ohms per square is a resistance measurement taken for the special case in which electrode length and spacing are identical and therefore mutually cancelling parameters.

The insulative supports can be formed of any one or combination of a variety of materials. Exemplary materials include vitreous materials, such as glass, glazed ceramics, porcelain, etc.; fibrous materials such as cardboard, fiberboard, paper (including bond paper), resin and clay-sized papers, wax or other transparentized paper, paperboard, wood, etc.; cloths and fabrics, including those of silk, cotton, viscose rayon, etc.; natural polymers and colloids, such as gelatin, polysaccharides; natural and synthetic waxes including paraffin, beeswax, carnauba wax, etc.; natural and synthetic rubbers such as butadiene-acrylonitrile copolymers, 2-chloro-1,3-butadiene polymers, etc.; synthetic resins and plastics, including polyolefins such as polyethylene, polypropylene, etc.; halogenated hydrocarbon polymers such as polytetrafluoroethylene, polyhexafluoropropylene, chlorotrifluoroethylene, etc.; polymers and copolymers of vinyl and vinylidene monomers such as poly(vinyl chloride), poly(vinylidene chloride), copoly(vinyl chloride-co-vinyl acetate), copoly(vinyl acetate-co-alkylacrylate), copoly(vinyl acetate-co-alkylmethacrylate), copoly(vinylidene chloride - coalkyl methacrylate), polystyrene, poly(vinyl acetals)—e.g., poly(vinyl butyral), poly(vinyl formal), etc., poly(vinyl alcohol); polyamides such as poly(hexamethylene adipamide); polyimides; alkyl acrylate addition polymers and copolymers such as poly(methylmethacrylate), poly(ethylmethacrylate), etc.; polyurethanes; polycarbonates, polyesters such as poly(ethylene terephthalate), copoly(ethylene terephthalate-co-ethylene isophthalate), and other esters formed by condensing terephthalic acid and its derivatives with propylene glycol, diethylene glycol, tetramethylene glycol, cyclohexane-1,4-dimethanol, and the like; cellulose ethers such as methyl cellulose, ethyl cellulose and benzyl cellulose; cellulose esters and mixed esters including cellulose acetate, cellulose triacetate, cellulose propionate, cellulose nitrate and cellulose diacetate; phenolic resins; melamine-formaldehyde resins; alkyd resins; epoxy resins and other conventional synthetic resins and plastics.

Particularly preferred are flexible supports capable of withstanding high temperatures. While such supports can be formed from a variety of the support materials noted above, we have found polyesters capable of withstanding temperatures high enough to permit metal soldering to electrical conductors located thereon to be particularly attractive. Exemplary preferred polyesters of this type are polyesters derived from 1,1,3-trialkyl-5-carboxy-3-(carboxyphenyl)indan and aromatic diols, such as Bisphenol A; polyesters of 1,1′-spirobisindandiols and 1,1′-spirobisindandicarboxylic acids, and polyamides of 1,1′-spirobisindandiamines; polyesters derived from 3,6-dihydroxy-9,9-dimethyl-xanthene and polyesters derived from 7,7-dimethyl-7H-dibenzo(c,h)xanthene-5,9-disulfonyl halides.

The insulative support can be a unitary element consisting essentially of the above noted insulative materials. However, since only the surface of the insulative support adjacent the plating layer need exhibit an insulative surface resistivity, it is recognized that the insulative support can be a composite of a plurality of layers in which only that portion adjacent the plating layer is formed of the above noted insulative materials while the remaining portions are formed of any known and desired material or combination of materials, including conductive materials, such as metal layers.

In a preferred form, the insulative support is formed of a flexible insulative plastic sheet. The plastic sheet is preferably chosen to be sufficiently tough that the article can be handled without injury. Flexible plastic sheets of from about 10 to about 500 microns in thickness are preferred with those of from about 25 to 125 microns being particularly preferred for most applications. Particularly preferred are those plastic sheets that exhibit a high degree of dimensional stability, resistance to thermal degradation, tensile strength, dielectric strength and/or chemical inertness.

A specifically preferred support is a poly(ethylene terephthalate) support having a thickness of from about 25 to 125 microns. This support is thin, flexible, comparatively dimensionally stable and capable of producing dry photoresist articles according to this invention which can be readily handled without injury.

In order to facilitate adhesion of the plating layer, the insulative support can include one or more insulative subbing layers between the plating layer and the remainder of the insulative support. A variety of suitable layers are known to the art. It is, of course, appreciated that the optimum composition of the subbing layer will vary as a function of the materials in the plating layer and the insulative support to which it is expected to bond. For a poly(ethylene terephthalate) plastic sheet bearing a plating layer of copper it has been found particularly advantageous to utilize subbing layers of gelatin. Nadeau et al. in U.S. Pats. 3,143,421 and 3,271,345 set forth subbing compositions useful in bonding copper to poly(ethylene terephthalate) plastic sheets. These include copolymers made up on a weight basis of the following monomers: (a) 35 to 96% vinylidene chloride or vinyl chloride; (b) 0.5 to 25% itaconic acid, alpha-methacrylic acid, acrylic acid, citraconic acid, mesaconic acid, maleic acid, fumaric acid or other polymerizable ethylenically unsaturated carboxylic compound (including the anhydrides and half-esters of those which are dibasic); and (c) 0 to 64.5% acrylic ester, alpha-methacrylic ester, acrylonitrile, or other polymerizable vinyl or vinylidene monomer different from (a) and (b). The above copolymers can also be used in combination with from about 0.1 to 5% by weight, based on the weight of the copolymer, of a dihydroxy aromatic compound such as resorcinol; 4-chloro-resorcinol; 2,4-dihydroxy toluene; 1,3-naphthalene diol; 1,6-naphthalene diol or mixtures thereof. Polyalkylenimines, such as disclosed by Justice et al. U.S. Pat. 2,999,782, are also quite useful in bonding a plating layer, such as a copper layer, to a sheet of poly(ethylene terephthalate).

The plating layer can be any single layer or any combination of layers having an aggregate thickness of less than 10,000 angstroms and, for maximum savings of material, of less than 5,000 angstroms, which is capable of facilitating firm, adherent bonding to a metal layer to be formed thereof. The plating layer is also chosen to be removable with an etchant, preferably an etchant which will also remove unexposed overlying portions of the photoresist layer. In the preferred form the plating layer has the capability of permitting the metal layer to be selectively plated on its exposed areas. It is preferred to electroplate or electrolessly deposit a metal layer selectively onto the exposed portions of the plating layer.

When the plated layer is to be formed by electroplating, the plating layer must be sufficiently electrically conductive to act as a cathode and is preferably formed of a metal. The plating layer can be conveniently formed by known techniques for forming thin metal layers, such as electroless deposition, sputtering or vacuum vapor depositing. Any etchable metal which is known to be capable of deposition as a thin layer can be used. Metals such as copper, silver, manganese, iron, cobalt, nickel and zinc are particularly attractive for use in forming conductors for electrical circuits.

In order to insure a firm bond of the plating layer to the supporting layer, the plating layer can be formed as a composite of layers. It has been found that the adherency of the above metal layers can be improved by first depositing from about 5 to 50 angstroms of a material such as chromium, titanium, titanium monoxide or chromium-silicon monoxide cermet known to improve adherency. When vapor deposition is employed, two metals can be advantageously plated from separate sources in a single plating operation, most preferably with some concurrent deposition occurring to insure intimate bonding.

Where it is desired to form the plated layer by electroless deposition, the plating layer can be formed of any material known to catalyze deposition of the plated metal. For example, when the plating layer is formed of copper, it will catalyze the electroless deposition of copper to form the plated layer. Other materials known to catalyze metal deposition can be used.

Each plated layer formed by deposition onto an exposed surface of the plating layer can be formed of one or more metal layers. The plated layers are preferably electrically conductive metal layers that are tenaciously adherent to the plating layer and to the underlying insulative support. For most electrical applications the plated layers are preferably copper, silver, gold, nickel or other metals known to have excellent electrical conduction properties. In many instances at least a portion of the plated layer is chosen to permit attachment of other electrical conductors thereto. For example, the plated layer can include a solder overcoat or a noble metal surface coating to reduce oxidation prior to soldering thereto. It is preferred to form the plated layers of metals that can be readily electrolessly deposited or electroplated, such as copper and nickel.

The photoresist layer can be formed of any photoresist composition known to have clean developing characteristics—that is, any composition which is capable of development in a substantially micro-residue free manner. Specifically, these are photoresist compositions which can be substantially completely removed from a metal surface without etching or otherwise damaging the metal surface. Typically the photoresist layer is a composition that can be readily removed with mild aqueous developers, such as an aqueous solution of an alkali metal carbonate, silicate, phosphate or the like or a dilute (0.1 N or less) alkali metal hydroxide, without disturbing a metal layer lying therebeneath. In this way the photoresist layer is developed without disturbing the thin plating layer, which can be readily destroyed with etchants conventionally used for cleaning metal surfaces prior to plating a metal thereon.

A preferred photoresist layer can be formed of a photopolymerizable composition comprised of a bisacryloyl monomer, a binder having clean development characteristics and a photoactivatable polymerization initiator. The bisacryloyl monomer can be any monomer having terminal acryloyl units. Specifically, the monomer can contain end units (A)

(A) $$CH_2{=}C(R^1){-}C({=}O){-}$$

wherein $R^1$ is hydrogen o ralkyl of from 1 to 4 carbon atoms. Particularly preferred bisacrylates are those indicated by formula (B)

(B) $$CH_2{=}C(R^1){-}C({=}O){-}R^2{-}C({=}O){-}C(R^1){=}CH_2$$

wherein $R^1$ is as defined above and $R^2$ is a linking group having the structure (C) or (D)

(C)
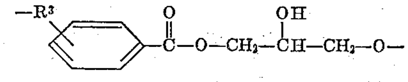

(D)
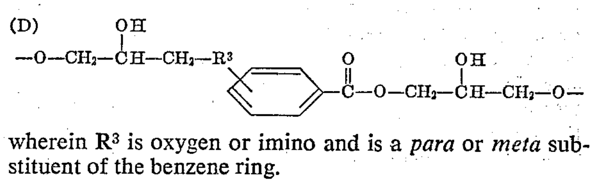

wherein $R^3$ is oxygen or imino and is a *para* or *meta* substituent of the benzene ring.

Exemplary preferred monomers include the following:

2-hydroxy-3-acryloyloxypropyl 3-(2-hydroxy-3-acryloyloxypropoxy)benzoate,
2-hydroxy-3-acryloyloxypropyl 4-(2-hydroxy-3-acrylolyloxypropylamino)benzoate,
2-hydroxy-3-acryloylpropyl 3-(2-hydroxy-3-methacryloyloxypropoxy)benzoate,
2-hydroxy-3-acryloyloxypropyl 4-(2-hydroxy-3-methacryloyloxypropoxy)benzoate,
2-hydroxy-3-acryloyloxypropyl 3-(2-hydroxy-3-methacryloyloxypropylamino)benzoate,
2-hydroxy-3-acryloyloxypropyl 4-(2-hydroxy-3-methacryloyloxypropylamino)benzoate,
2-hydroxy-3-methacryloyloxypropyl 4-acryloyloxybenzoate,
2-hydroxy-3-methacryloyloxypropyl 3-acrylamidobenzoate,
2-hydroxy-3-methacryloyloxypropyl 4-methacryloyloxybenzoate,
2-hydroxy-3-methacryloyloxypropyl 3-methacryloyloxybenzoate,
2-hydroxy-3-methacryloyloxypropyl 4-methacrylamidobenzoate,
2-hydroxy-3-methacryloyloxypropyl 3-methacrylamidobenzoate,
2-hydroxy-3-methacryloyloxypropyl 4-(2-hydroxy-3-acryloyloxypropoxy)benzoate,
2-hydroxy-3-methacryloyloxypropyl 3-(2-hydroxy-3-acryloyloxypropylamino)benzoate,
2-hydroxy-3-methacryloyloxypropyl 4-(2-hydroxy-3-methacryloyloxypropoxy)benzoate,
2-hydroxy-3-methacryloyloxypropyl 3-(2-hydroxy-3-methacryloyloxypropoxy)benzoate,
2-hydroxy-3-methacryloyloxypropyl 4-(2-hydroxy-3-methacryloyloxypropylamino)benzoate,
2-hydroxy-3-methacryloyloxypropyl 3-(2-hydroxy-3-methacryloyloxypropylamino)benzoate,
2-hydroxy-3-acryloyloxypropyl 4-acryloyloxybenzoate,
2-hydroxy-3-acryloyloxypropyl 3-acryloyloxybenzoate,
2-hydroxy-3-acryloyloxypropyl 4-acryloyloxybenzoate,
2-hydroxy-3-acryloyloxypropyl 4-methacryloyloxybenzoate,
2-hydroxy-3-acryloyloxypropyl 3-methacryloyloxybenzoate,
2-hydroxy-3-acryloylpropyl 4-methacrylamidobenzoate,
2-hydroxy-3-acryloyloxypropyl 3-methacrylamidobenzoate,
1,4-bis(methacryloyloxymethyl)cyclohexane,
1,3-dimethylacryloyloxy-2,2,4,4-tetramethylcyclobutane,
1,4-bis(2-methacryloxyethoxy)benzene
2-hydroxy-3-methacryloyloxypropyl-2-methacrylamidopropionate These photopolymerizable monomers can be prepared using standard condensation techniques. For example, a cycloalkylene diol, alanine or *para-* or *meta-*hydroxy or aminobenzoic acid can be condensed with a suitable acrylate reactant. Taking the benzoic acid moiety for purposes of providing a specific illustration, when both the carboxy group and the hydroxy or amino group on the benzoic acid are to be substituted with the same acryloyl group, a one-step reaction is employed in which the benzoic acid is condensed with a reactant such as glycidyl acrylate. This is illustrated by reaction sequence (E) below. When the carboxy group and the hydroxy or amino group on the benzoic acid are to be substituted with different acryloyl groups, a two-step reaction is employed in which the hydroxy or amino group is first condensed with an acryloyl chloride (which does not react with the carboxy group) and then the carboxy group is condensed with a reactant such as glycidyl acrylate. This is illustrated by reaction sequence (F) below.

(E)

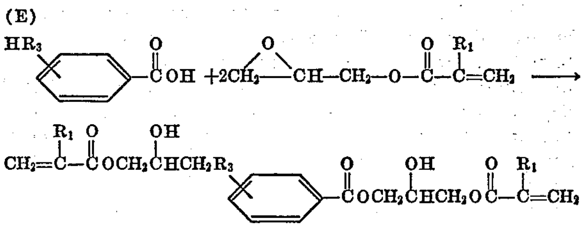

(F)

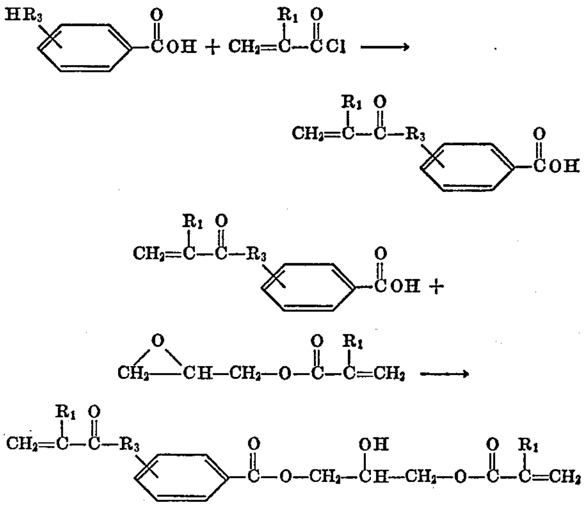

Typically, the one step reaction is carried out at elevated temperatures, e.g., 50–100° C., in the presence of a thermal polymerization inhibitor, e.g., p-methoxyphenol, quinone, hydroquinone, m-dinitrobenzene, phenothiazine, and the like, and a catalyst which will aid cleavage of the glycidyl ring, e.g., tetramethyl ammonium chloride, sodium chloride, sodium hydroxide, sodium bicarbonate, lithium acetate, and the like, and, optionally, in a solvent such as acetone, acetonitrile, tetrahydrofuran, N,N-dimethylformamide, dimethylsulfoxide, and the like. The first step of the two-step reaction is typically carried out at reduced temperatures, e.g., 0–10° C., in a solvent mixture such as a mixture of methylene chloride with water or pyridine, and in the presenence of an acid acceptor such as sodium hydroxide, pyridine, trimethylamine, triethylamine, and the like. The second step of the two-step reaction can be performed using the same materials and conditions as the one-step reaction.

Exemplary of preferred binders useful in forming photoresist layers of exceptionally clean development characteristics are terpolymers of methyl methacrylate, ethyl acrylate and methacrylic acid in proportions of from 40% to 65%, 20% to 45% and 10% to 25%, respectively, on a mole basis. These polymeric binders can be prepared by any of the addition polymerization techniques known to those skilled in the art, which include solution polymerization, bulk polymerization, bead polymerization, etc., in the presence of a free radical generating polymerization initiator such as peroxy compounds, e.g., benzoyl peroxide, di(tertiary amyl) peroxide, or diisopropylperoxy carbonate, azo initiators, e.g., 1,1′ azodicyclohexanecarbonitrile, 2,2′-azobis(2-methlpropionitrile), and the like.

The polymerization reaction can be carried out in the presence of an inert solvent. Preferably, a low molecular weight alcohol which is a good chain transfer agent, e.g., ethyl alcohol, is used to promote formation of lower molecular weight polymers by a solution polymerization technique. Molecular weight can also be controlled by varying the temperature (the higher the initial temperature, the lower the molecular weight) or by varying the amount of catalyst used (the more catalyst, the lower the molecular weight). Preferably, the polymerization reaction is performed in an inert atmosphere, e.g., under a blanket of nitrogen. The polymerization mixture is maintained at a temperature at which the polymerization initiator generates free radicals. The exact temperature selected depends on the monomers being polymerized, the particular initiator being used, and the molecular weight desired. Temperatures ranging from room temperature or lower up to about 100° C. are suitable. It is usually desirable to carry the polymerization reaction substantially to completion so that no unpolymerized monomers remain and the proportions of each component in the final product are esentially those of the original monomer mixture.

The polymeric binder can be collected and purified by conventional techniques, such as precipitation into a nonsolvent for the polymer followed by washing and drying.

The photoactivatable polymerization initiators to be incorporated can be any of the photopolymerization initiators known and employed in the art. Preferably, these compounds are thermally inactive at temperatures encountered during storage and handling of the compositions and elements prepared therewith, i.e., temperatures below about 100° C.

Suitable initiators include aryldiazo sulfones such as those described in Rauner et al. U.S. Application Serial No. 46,517, filed June 15, 1970, which also describes suitable sensitizers for these initiators. Other suitable initiators include polynuclear quinones, such as those described in U.S. Pat. 3,046,127, e.g., 9,10-anthraquinone, 2-t-butylanthraquinone, 1,4 - naphthoquinone, 9,10 - phenanthraquinone, 1,2 - benzanthraquinone, etc.; vicinal polyketaldonyl compounds, such as are described in U.S. Pat. 2,367,660, e.g., diacetyl, benzil, etc., α-ketaldonyl alcohols, such as those described in U.S. Pats. 2,367,661 and 2,367,670, e.g., benzoin, pivaloin, etc.; acyloin ethers, such as those described in U.S. Pat. 2,448,828, e.g., 2-methoxy-2-phenylacetophenone, 2 - ethoxy-2-phenyl-acetophenone, etc.; α-hydrocarbon substituted aromatic acyloins, such as are described in U.S. Pat. 2,722,512, e.g., α-methyl benzoin, α-allylbenzoin, α-phenylbenzoin, etc.; and the like initiators. Particularly preferred are the synergistic mixtures of initiators described in U.S. Pat. 3,427,161, e.g., mixtures of benzophenone, a p,p' - dialkylaminobenzophenone, or fluorenone with a different initiator taken from the group of benzoin, benzoin methyl ether, anthraquinone, 2 - methylanthraquinone, benzophenone, benzil, xanthone, 1,3,5 - triacetylbenzene, fluorenone, fluorene, diacetyl, propiophenone or benzaldehyde. Particularly preferred is the mixture of benzophenone with p,p'-dimethylaminobenzophenone, also known as Michler's ketone.

The photoresist layer can also incorporate thermal polymerization inhibitors to prevent premature polymerization of the composition during storage and handling. Suitable such inhibitors include p-methoxyphenol, hydroquinone, alkyl and aryl-substituted quinones and hydroquinones, t-butylcatechol, pyrogallol, copper resinate, naphthylamines, beta-naphthol, cuprous chloride, 2,6-di-t-butyl p-cresol, phenothiazone, pyridine, nitrobenzene, dinitrobenzene, p-toluquinone, chloranil, and the like.

The photoresist layer also can include a variety of photographic addenda utilized for their known purposes, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Coating compositions used to form the photoresist layer can be prepared by dispersing or dissolving the photoresist constituents in any suitable solvent or combination of solvents used in the art to prepare coating dopes. Solvents that can be used to advantage are volatile organic solvents and include ketones such as 2-butanone, acetone, 4-methyl - 2 - pentanone, cyclohexanone, 2,4-petanedione, 2,5-hexanedione, etc.; esters such as 4-butyrolactone, 2-ethoxyethyl acetate, 2-methoxyethyl acetate, ec.; ethers such as 2-methoxyethanol, 2-ethoxyethanol, tetrahydrofuran, etc.; and mixtures of these solvents.

Typically, the photopolymerizable monomer can be present in the photoresist layer in the range of from about 16 to 60 percent by weight, based on the total weight of the photoresist layer. The binder can be present in the range of from 35 to 83 percent by weight, based on the total weight of the photoresist layer. The preferred range of initiator concentration is from 5 to 20 percent by weight, based on the weight of the photopolymerizable compound. In its preferred form and in which the article incorporating the photoresist layer is intended to be flexible, the photoresist layer preferably exhibits a thickness in the range of from 10 to 100 microns, most preferably from 25 to 40 microns.

Certain preferred photoresist compositions useful in the practice of this invention are more fully disclosed in Noonan et al. patent application Ser. No. 348,578, filed concurrently herewith, titled Photopolymerizable Compositions and Elements and Uses Thereof.

The cover sheet is used to protect the photoresist layer. For example, the cover sheet together with the insulative support or plating layer can be opaque to protect the photoresist layer from accidental exposure to actinic radiation. The cover sheet can also be transparent or substantially so where it is desired to expose the photoresist layer through the cover sheet. The cover sheet in this instance functions primarily to protect the photoresist layer from damage in handling or from chemical attack—e.g., oxidation. The cover sheet can be formed of any material which is not directly reactive with the photoresist layer. The cover sheet can be formed of any of the materials previously noted as useful in forming the insulative support. In the preferred form, the cover sheet is a thin, strippable plastic sheet of a thickness no greater than that of the insulative support. Polyethylene is a specific preferred low cost cover sheet material. The cover sheet can also usefully take the form of a thin, flexible metal foil or foil covered paper, since there is no requirement that the cover be electrically insulative. It is also contemplated that the cover sheet can take the form of a coating which is dissolved rather than stripped from the photoresist layer. In one form, the cover sheet can be a transparent coating that is dissolved by the developer for the photoresist.

The following examples further illustrate certain preferred embodiments of this invention:

EXAMPLE 1

To illustrate a specific, preferred embodiment of our invention, a sheet of poly(ethylene terephthalate) having a thickness of 25 microns was provided with a subbing layer of poly(methylacrylate - co - vinylidene chloro-co-itaconic acid) prepared as described in Example I of U.S. Pat. 3,271,345. This subbing layer was in turn washed with an aqueous gelatin solution which left a thin gelatin layer of about 1 micron or less in thickness. The subbed support was next treated in a commercially available cleaning solution of sodium carbonate and tetrasodium pyrophosphate having a pH of 11.2 for 1 minute at 71° C. for the purposes of improving the adhesion of the plating layer. The support was then catalyded for electroless deposition of the plating layer by dipping the support in tin-palladium hydrosol. A plating layer of copper of approximately 4000 Angstroms in thickness was next deposited on the catalyzed support over the subbing layers using a conventional electroless copper plating procedure. Such procedures are disclosed in Technical Data Sheets 9070, 9071 and 9072 published by MacDermid Incorporated, Waterbury, Conn.

After rinsing, the support bearing the plating layer was dried, and a photoresist layer was immediately formed over the plating layer. This was accomplished by preparing a coating composition formed by diluting two parts by volume of the following stock solution with one part by volume of 2-ethoxyethanol:

| | G. |
|---|---|
| Poly(methyl methacrylate-co - ethyl acrylate - co-methacrylic acid) (mole ratio 50:34:16), inherent viscosity in N,N-dimethylformamide 0.23 at 20° C. | 250 |
| 3-Methacryloyloxy - 2 - hydroxypropyl - 4 - methacyloyloxybenzoate | 200 |
| Michler's Ketone | 5 |
| Benzophenone | 35 |
| *p*-Methoxyphenol | 0.2 |
| 2-Ethoxyethanol | 490.2 |

The coating composition was applied to the support and plating layer while the latter was rotated at 80 r.p.m. to yield a thin, uniform coating capable of producing a photoresist layer thickness of 18 microns when dry. After drying at ambient temperature the photoresist coated support was placed in a convection oven for 5 minutes at 80° C.

On removal from the oven the article was allowed to cool and a protective cover sheet of 25 microns thickness of cellulose acetate was applied by means of a smooth rubber roller. Sufficient pressure was applied with the roller to provide an intimate contact between the photoresist coating and the cover sheet. The resultant article was flexible, yet could be readily handled without damage.

EXAMPLE 2

To demonstrate the utility of the article of Example 1, the photoresist layer was exposed through a patterned film mask after stripping the cover sheet. A light source commercially available under the trademark Colight M–218 that is rich in the near-ultraviolet region of the spectrum was used to give a 2 minute exposure.

The unexposed portions of the photoresist layer were removed with an aqueous base developer having a pH of 10.3 of the following composition:

| | Cc. |
|---|---|
| 0.25 m. Trisodium Phosphate | 100 |
| 0.50 M Disodium Phosphate | 420 |
| Water | 100 |

Development of the image was achieved by spraying the developer for one minute at a pressure of 60 p.s.i.g. The photoresist cleaned out very well so that no residues were visible.

The exposed portions of the plating layer were next electroplated. This was accomplished using conventional electroplating techniques by using the plating layer as the cathode. An acid copper sulfate plating solution was used to deposit copper in the areas from which the photoresist layer had been removed by development. Plating was continued until a plated layer of 25 microns was formed.

The exposed remnants of the photoresist layer were then removed with 0.1 N sodium hydroxide in a period of between 1 and 2 minutes at ambient temperature. Thereafter the surface was rinsed with water to wash away additional photoresist residues. The portions of the plating layer underlying the photoresist remants were removed using ammonium persulfate in a matter of seconds. The plated layer protected the remnants of the plating layer there-beneath from attack. The finished article was then rinsed, dried and baked in an oven to insure complete removal of moisture associated therewith. The article after standing for 24 hours was noted to demonstrate very good adhesion of the plated layer, indicating that the photoresist had been developed from the plating layer in substantially microresidue free manner. Because of the image pattern utilized the resulting article was noted to form a flexible printed circuit.

EXAMPLE 3

The procedures of Examples 1 and 2 were repeated with similar results, but with the variation that a subbing layer of poly(acrylonitrile-co-vinylidene chloride-co-acrylic acid) was substituted for the terpolymer used in the examples.

EXAMPLE 4

The procedures of Examples 1 and 2 were repeated with similar results, except that a subbing layer of gelatin containing 17% by weight glycerine was substituted for the poly(ethylene terephthalate) sheet.

EXAMPLE 5

The procedures of Examples 1 and 2 were repeated with similar results, except that the plating layer was an approximately 5000 Angstrom nickel layer which was electrolessly deposited using conventional procedures. Such procedures are described in Technical Data Sheet 9345 supplied by MacDermid Incorporated, Waterbury, Conn.

EXAMPLE 6

The procedures of Examples 1 and 2 were repeated with similar results, except that a sheet of poly(ethylene terephthalate) of 178 microns thickness was utilized and the plating layer was formed by first vapor vacuum depositing about 100 Angstroms of titanium monoxide followed by 1000 Angstroms of copper. The copper was prepared to receive the plated layer by using a 3% by volume solution of sulfuric acid to remove copper oxides.

EXAMPLE 7

The procedures of Example 6 were repeated, but with the variation that a sheet of polyimide sold under the trademark Kapton was substituted for the sheet of poly(ethylene terephthalate).

EXAMPLE 8

The procedures of Examples 1 and 2 were repeated with similar results, except that a high resolution glass plate subbed with a thin gelatin layer of less than 1 micron in thickness was substituted for the insulative support used in Example 1. Further, the gelatin subbed glass plate was prepared to receive the plating layer by soaking for one minute in water at 55° C. Also, prior to applying the photoresist layer the insulative support and plating layer were heated for 10 minutes at 80° C. and allowed to cool.

EXAMPLES 9 THROUGH 13

The articles of Example 1 were prepared, but with the photoresist layer being modified by substituting in each instance one of the binders set forth in Table I.

TABLE I

| Terpolymer | Mole percentage methyl methacrylate | Ethyl acrylate | Inherent* viscosity |
|---|---|---|---|
| A | 34 | 50 | 0.14 |
| B | 42 | 42 | 0.20 |
| C | 50 | 34 | 0.20 |
| D | 59 | 25 | 0.21 |
| E | 67 | 17 | 0.22 |

* Measured in N,N-dimethylformamide at 25° C. at a concentration of 0.25 g./deciliter.

Each terpolymer contained 16% on a mole basis of methacrylic acid. The terpolymers were prepared as disclosed in the above-referenced, concurrently filed Noonan et al. patent application, which employs a conventional polymer preparation procedure.

EXAMPLES 14 AND 19

The articles of Examples 9 through 13 were first stripped of their cover sheets. Each of the photoresist coatings were then exposed through a Kodak Control Scale T-14, which is a 14 step density scale ranging from a density of 0.04 (step 1) to 2.05 (step 14) at 0.15 increments. The photoresist image was developed by spraying with a 4 percent sodium carbonate solution for 60 seconds, followed by water rinse and air drying. To insure that no oxides were present on the copper surfaces exposed during development these exposed areas were washed with a 3% by volume sulfuric acid solution and rinsed with water. Since sulfuric acid does not etch copper, no metal was removed during this step nor were micro-residues of photoresist, if present, removed. Copper was plated onto the exposed areas of the supports using a copper sulfate plating bath. Properties of the processed supports are summarized in Table II. Speed is designated in terms of the number of steps which developed.

TABLE II

| Terpolymer | Speed | Development | Cleanout |
|---|---|---|---|
| A | 8 | Excellent | Excellent. |
| B | 8 | do | Do. |
| C | 8 | do | Do. |
| D | 7 | Very good | Do. |
| E | 7 | Poor | Poor. |

The supports coated with Terpolymers A, B, C and D all gave acceptable development properties. The support coated with Terpolymer D need somewhat longer contact with the developer to obtain equivalent removal of the photoresist layer. For this reason the spraying of the photoresist layer containing Terpolymer D was extended 30 seconds. The supports coated with Terpolymers A, B, C and D developed as indicated were all substantially free of micro-residues that interfere with plated copper adhesion. In each of these elements the copper tenaciously adhered to the cleaned surface without etching. In the case of the article containing Terpolymer E, spraying did not achieve development of the photoresist layer. While development was achieved by swabbing, this photoresist is not preferred, since swabbing is not compatible with forming very intricate or fine patterns. The coating containing Terpolymer A exhibited very high speed together with excellent development and cleanout properties. This terpolymer is not preferred, however, since it exhibits a somewhat lower degree of solidity after exposure as compared to the remaining coatings. This can interfere also with very fine image definition.

This invention has been described in detail with particular reference to preferred embodiments thereof, but it will be understood that variations and modifications can be effected within the spirit and scope of the invention.

We claim:

1. An article of manufacture comprising
electrically insulative support means,
an etchant destructible plating layer having a thickness of less than 10,000 Angstroms located on said support means and
radiation-sensitive layer means overlying one surface of said destructible plating layer capable of substantially micro-residue free removal from said plating layer surface in unexposed areas while protecting said destructible plating layer in remaining areas subsequent to radiation exposure wherein the radiation-sensitive layer means comprises a photopolymerizable composition comprising,
(a) an ethylenically unsaturated monomer which is a bisacrylate of a *p*- or *m*-hydroxy or amino benzoic acid,
(b) a film forming carboxylated polymeric binder, and
(c) a photoactivatable polymerization initiator.

2. An article according to Claim 1 additionally including protective means overlying said radiation-sensitive layer means.

3. An article according to Claim 1 additionally including a thin, flexible cover sheet overlying said radiation sensitive layer means.

4. An article according to Claim 1 additionally including transparent protective means overlying said radiation-sensitive layer means.

5. An article according to Claim 1 additionally including opaque protective means overlying said radiation-sensitive layer means.

6. An article according to Claim 1 in which said insulative support means exhibits a thickness in the range of from 10 to 500 microns.

7. An article according to Claim 1 in which said insulative support means exhibits a thickness in the range of from 25 to 125 microns.

8. An article according to Claim 1 in which said insulative support means is comprised of a thin, flexible sheet of poly(ethylene terephthalate) or polyimide.

9. An article according to Claim 1 in which said insulative support means includes subbing layer means for facilitating adhesion of said plating layer to said insulative support means.

10. An article according to Claim 1 in which said insulative support means includes a gelatin subbing layer.

11. An article according to Claim 1 in which said insulative support means is comprised of a polymer subbing layer consisting essentially of poly(methyl acrylate-co-vinylidene chloride-co-acrylic acid).

12. An article according to Claim 11 in which said insulative support means additionally includes a gelatin subbing layer overlying said polymer subbing layer.

13. An article according to Claim 1 in which said plating layer is comprised of a vapor deposited metal layer.

14. An article according to Claim 1 in which said plating layer is formed of means capable of catalyzing the electroless deposition of a metal.

15. An article according to Claim 1 in which said plating layer is a conductive metal layer.

16. An article according to Claim 1 in which said plating layer is comprised of copper.

17. An article according to Claim 1 in which said plating layer is comprised of nickel.

18. An article of manufacture comprising
electrically insulative support means,
an etchant destructible plating layer located on said support means having a thickness of less than 10,000 Angstroms and
a layer of a photopolymerizable composition capable of being developed without etching to leave said plating layer substantially free of micro-residues comprising
a bisacryloyl monomer having the formula

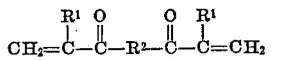

wherein $R^1$ is hydrogen or alkyl of 1 to 4 carbon atoms and $R^2$ is a linking group having the structure

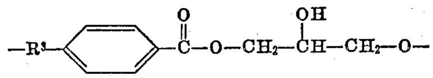

or,

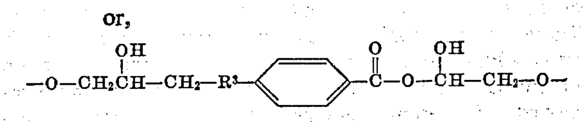

where $R^3$ is oxygen or imino substituted in the *para* or *meta* position of the benzene ring
a film forming polymeric binder which is a polymer of from 40 to 65 mole percent methyl methacrylate, 20 to 45 mole percent ethyl arcylate and 10 to 25 mole percent methacrylic acid and
a photopolymerization initiator.

19. A printed circuit precursor comprising
a flexible poly(ethylene terephthalate) or polyimide support, an electrically insulative subbing layer means overlying said support, an etchant destructible plating layer located on said subbing layer means having a thickness of less than 5,000 Angstroms and a layer of a photopolymerizable composition having clean development characteristics comprising (a) 16 to 60 percent by weight of an ethylenically unsaturated monomer having the structure $$CH_2=C(R^1)-C(=O)-R^2-C(=O)-C(R^1)=CH_2$$

wherein: $R^1$ is hydrogen or alkyl of 1 to 4 carbon atoms, and $R^2$ is a linking group having the structure

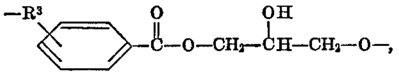

or

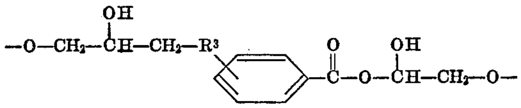

where, $R^3$ is oxygen or imino substituted in the *para* or *meta* position of the benzene ring:

(b) 35 to 83 percent by weight of a film forming polymeric binder which is a polymer of from 40 to 65 mole percent methyl methacrylate, 20 to 45 mole percent ethyl acrylate or 10 to 25 percent methacrylic acid; and (c) from 5 to 20 percent by weight, based on the weight of the ethylenically unsaturated monomer, of a photoactivatable polymerization initiator.

References Cited

UNITED STATES PATENTS

| | | | |
|---|---|---|---|
| 3,661,576 | 5/1972 | Crary | 96—115 P |
| 3,748,133 | 7/1973 | Nounan et al. | 96—115 P |
| 3,748,132 | 7/1973 | Arcesi et al. | 96—35.1 |
| 3,730,951 | 5/1973 | Braude | 204—159.16 |
| 3,607,292 | 7/1969 | Cerwonka | 96—115 P |
| 3,632,493 | 1/1972 | Rogers | 260—47 UA |
| 3,017,383 | 1/1962 | Lappin | 260—479 R |

RONALD H. SMITH, Primary Examiner

E. C. KIMLIN, Assistant Examiner

U.S. CL. X.R.

96—86 P, 87 R, 35.1, 36.2, 115 P, 36; 204—159.15, 159.16

UNITED STATES PATENT AND TRADEMARK OFFICE

CERTIFICATE OF CORRECTION

PATENT NO. : 3,832,176

DATED : August 27, 1974

INVENTOR(S) : Jerome A. Verstraete et al.

It is certified that error appears in the above-identified patent and that said Letters Patent are hereby corrected as shown below:

Column 2, line 17, "etched-resistant" should read --- etch-resistant ---; line 56, "been then" should read ---then been---.

Column 3, lines 28-29, "end-used" should read --- end-use ---; line 64, after "sheet" insert ---overlying the photoresist layer. The transparent cover sheet---.

Column 4, line 32, "Alternatively" should read ---Alternately---

Column 8, line 56, "o ralkyl" should read --- or alkyl ---.

Column 9, line 8, "acryloylpropyl" should read ---acryloyloxy-propyl---; line 42, "acryloyloxybenzoate" should read ---acryloylamidobenzoate---.

Column 10, line 1, that part of formula reading " 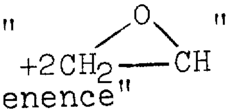 " should read --- 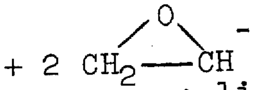 ---; line 46, "presenence" should read ---presence---; line 63, "1,1'" should read --- 1,1'- ---.

Column 11, line 12, "esentially" should read ---essentially---; line 58, "phenothiazone" should read ---phenothiazine---; line 75, "2,4-petanedione" should read ---2,4-pentanedione---;

Column 12, lines 16-17, "most pref- ably from" should read ---most preferably from---; line 55, "chloro-co-" should read ---chloride-co- ---; line 64, "catalyded" should read ---catalyzed---.

UNITED STATES PATENT OFFICE

CERTIFICATE OF CORRECTION

Patent No. 3,832,176 Dated August 27, 1974

Inventor(s) Jerome A. Verstraete et al.

It is certified that error appears in the above-identified patent and that said Letters Patent are hereby corrected as shown below:

Column 13, line 43, "100" should read --80--; line 63, "remants" should read -- remnants --.

Column 14, line 71, "Examples 14 and 19" should read -- Examples 14 through 19 --.

Signed and Sealed this

*fifteenth* Day of *June 1976*

[SEAL]

*Attest:*

RUTH C. MASON
*Attesting Officer*

C. MARSHALL DANN
*Commissioner of Patents and Trademarks*